(12) United States Patent
Oh et al.

(10) Patent No.: US 6,771,348 B2
(45) Date of Patent: Aug. 3, 2004

(54) DISPLAYING SUBSTRATE AND LIQUID CRYSTAL DISPLAY DEVICE HAVING THE SAME

(75) Inventors: Weon-Sik Oh, Suwon-si (KR); Hyeong-Suk Yoo, Seongnam-si (KR); Ju-Young Yoon, Gwangyok-si (KR); Won-Gu Cho, Seoul (KR)

(73) Assignee: Samsung Electronics Co., Ltd. (JP)

( * ) Notice: Subject to any disclaimer, the term of this patent is extended or adjusted under 35 U.S.C. 154(b) by 29 days.

(21) Appl. No.: 10/159,149

(22) Filed: May 30, 2002

(65) Prior Publication Data

US 2003/0164919 A1 Sep. 4, 2003

(30) Foreign Application Priority Data

Oct. 19, 2001 (KR) ........................................ 2001-64812

(51) Int. Cl.$^7$ ............................................ G02B 1/1345
(52) U.S. Cl. ...................... 349/152; 349/149; 349/150; 349/151; 174/258; 174/259; 174/260; 174/262; 174/263; 174/265; 174/266; 361/751; 361/760; 361/761; 361/762
(58) Field of Search ................................ 349/149, 151, 349/152, 150; 174/260, 262, 263, 265, 266, 258, 259; 361/748–751, 760–762, 780, 790–795

(56) References Cited

U.S. PATENT DOCUMENTS

| | | | | |
|---|---|---|---|---|
| 6,184,966 B1 | * | 2/2001 | Fujita et al. | 349/152 |
| 6,190,934 B1 | * | 2/2001 | Kang et al. | 438/30 |
| 6,285,433 B1 | * | 9/2001 | Kawasaki | 349/149 |
| 6,366,331 B1 | * | 4/2002 | Sakamoto et al. | 349/43 |

\* cited by examiner

*Primary Examiner*—Dung T. Nguyen
*Assistant Examiner*—Michael H. Caley
(74) *Attorney, Agent, or Firm*—Cantor Colburn LLP

(57) ABSTRACT

Disclosed are a displaying substrate and a liquid crystal display device having the same. A pad portion formed on the displaying substrate has a plurality of via holes for exposing a pad metal layer. A width of the via hole is smaller than a diameter of a conductive particle. Where the width of the via hole is larger than the diameter of the conductive particle, a depth of the via hole is smaller than the diameter of the conductive particle. Thus, a driving failure which may occur in the pad portion is prevented while maintaining a deformation ratio of the conductive particle at about 20~60%, thereby enhancing a connecting force between the pad portion and a circuit substrate.

17 Claims, 17 Drawing Sheets

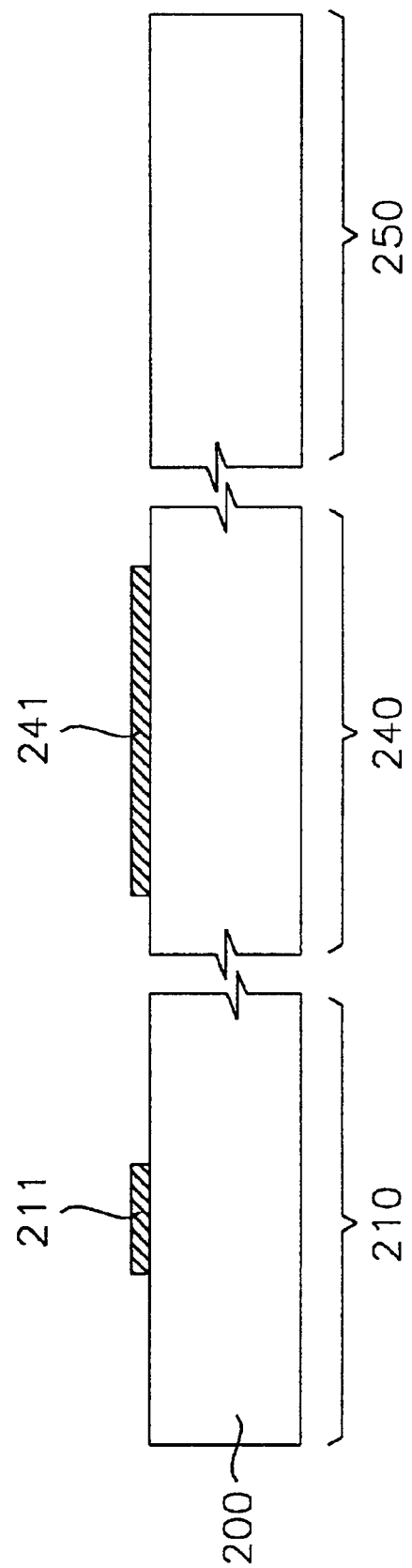

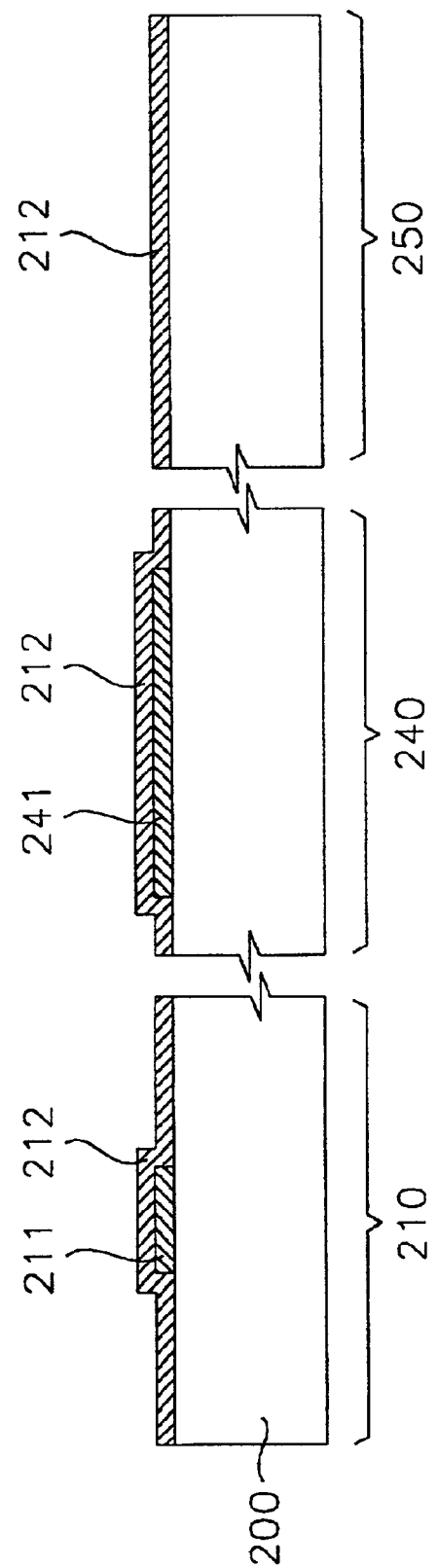

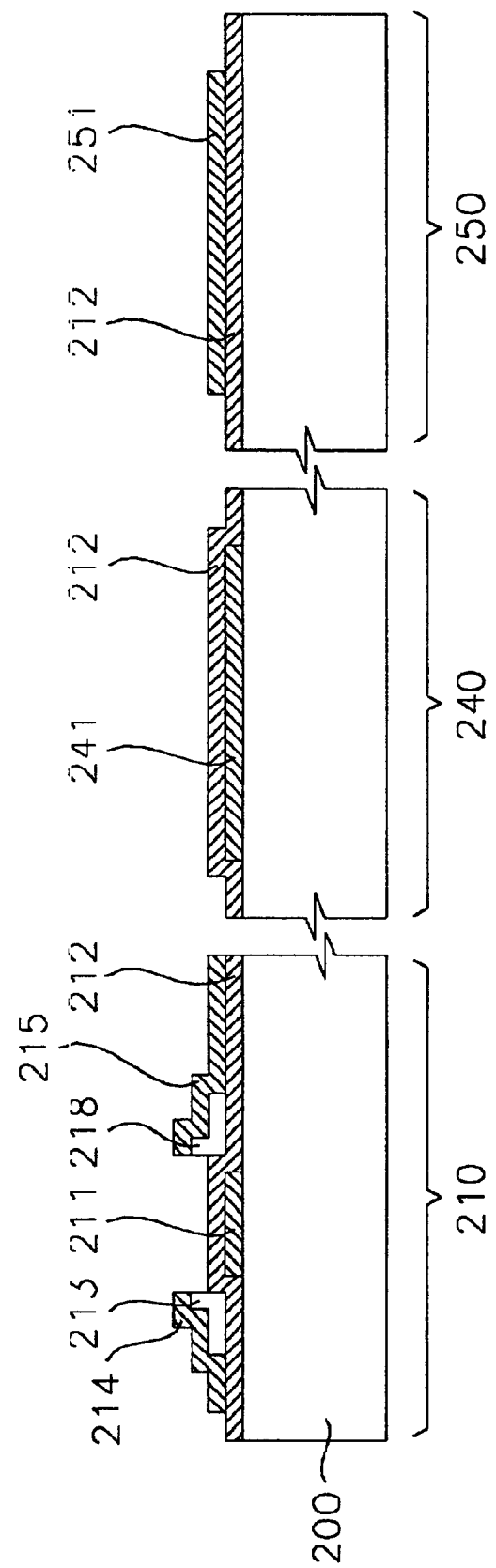

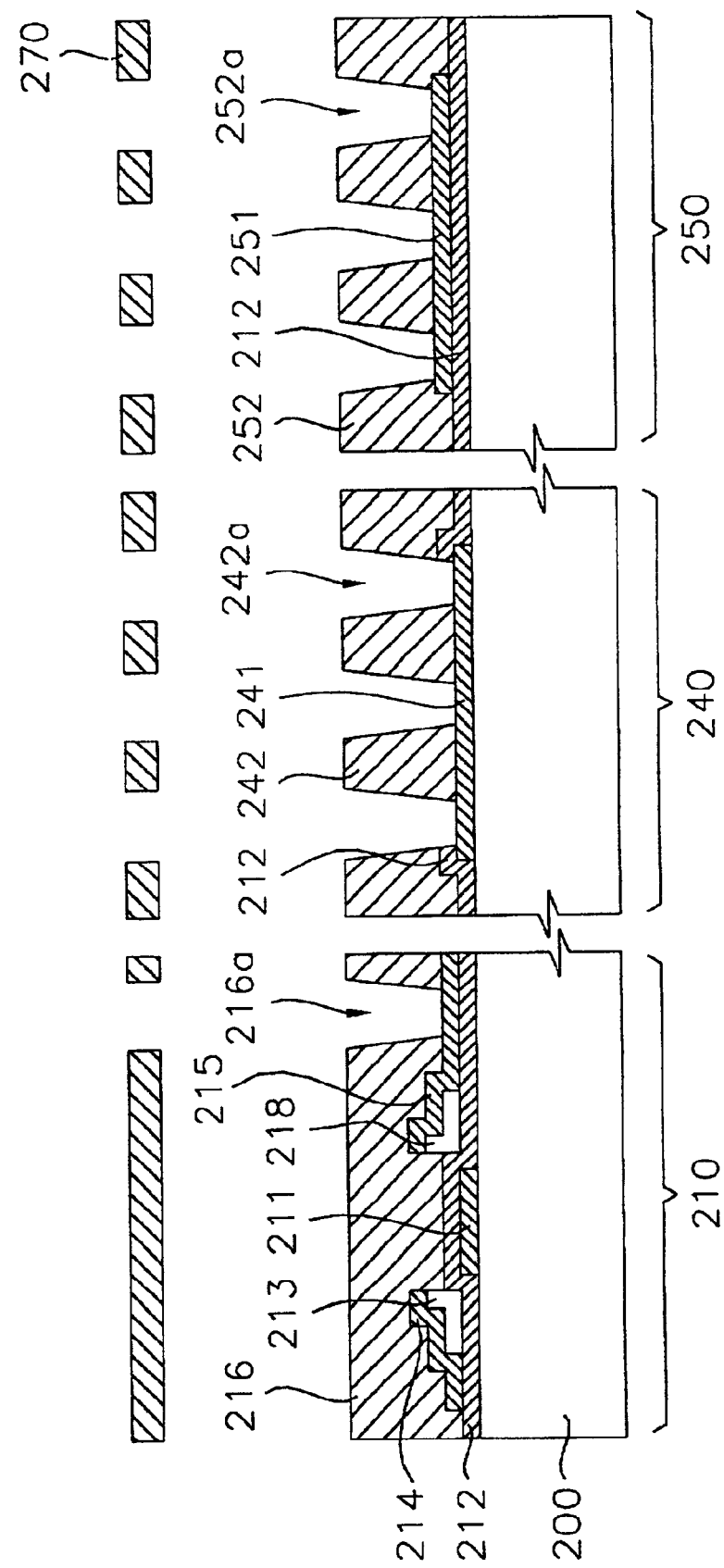

DISPLAYING SUBSTRATE AND LIQUID CRYSTAL DISPLAY DEVICE HAVING THE SAME

BACKGROUND OF THE INVENTION

1. Field of the Invention

The present invention relates to a liquid crystal display device (hereinafter referred to as "LCD"), and more particularly to a displaying substrate formed with a pad portion capable of enhancing contact characteristics with a circuit substrate for applying electric signals to the displaying substrate, and an LCD having the same.

2. Description of the Related Art

Information-processing appliances have been rapidly developed to have a variety of shapes and functions and much faster information processing speed. Information in the form of an electrical signal processed in such an information-processing appliance requires a displaying device serving as an interface.

Compared with a CRT-type display device, a flat type display device has various advantages such as lighter weight and smaller size. Moreover, the flat type display device is able to realize full colorization and high resolution. The LCD is one of currently available flat-type display devices, which is provided with a liquid crystal display panel including two sheets of substrates formed with electrodes and a liquid crystal layer injected between the two substrates. Images are displayed in such a manner that the quantity of light transmitted is adjusted by applying a voltage to the electrodes of the liquid crystal display panel to rearrange the liquid crystal molecules of the liquid crystal layer.

Generally, in order to precisely display the detailed images on the liquid crystal display panel of the LCD, an image data generated from an external information processing apparatus should be converted into driving signals which are suitable for driving the liquid crystal display panel. The driving signals are applied to the liquid crystal display panel at proper timing.

For embodying such an operation, the LCD requires a process of signal processing upon the image data on a driving printed circuit substrate prior to being applied to the liquid crystal display panel.

In order to allow the LCD to carry out the full-color display, signal lines including gate lines and data lines are densely formed within a certain area of the TFT substrate. Also, a pad formed to be wider than the area occupied by the signal lines is connected to one end of the signal lines.

A medium for transmitting signals are required so as to apply the driving signals generated from the driving printed circuit substrate to the densely formed signal lines at an accurate timing. Chip On Glass (COG), Chip On Film (COF), Flexible Printed Circuit film (FPC) or Tape Carrier Package (TCP) are mainly employed as the medium. One end of the medium is connected to the driving printed circuit substrate while the other end thereof is electrically connected to the pad to be firmly fixed.

An interval between the pad and adjacent pad is too narrow as described above to utilize a method such as a fine welding typically employed for connecting the pad with the medium. For this reason, the pad is electrically and mutually connected with the medium by interposing an Anisotropic Conductive Film (ACF).

The ACF includes an adhesive tape and conductive particles regularly arranged in the adhesive tape. The conductive particle is smaller than several micrometers in diameter. That is, the conductive layer having an adhesive material and conductive particles and a passivation layer form the ACF. The conductive particles serve for applying the signal transmitted via the medium to the liquid crystal display panel via the pad. The conductive particles have one directional orientation in transmitting the signal. In other words, the signal from the medium can be applied to the liquid crystal display panel; on the contrary the signal from the liquid crystal display panel cannot be transmitted to the medium.

Additionally, the ACF is thermally compressed under the state of being interposed between the liquid crystal display panel and medium to be adhesively bonded therewith. The pad of the liquid crystal display panel and the medium are bonded with each other by means of the adhesive material, and further they are firmly attached to each other by a restoring force originated from an elastic deformation of the conductive particles.

FIG. 1 is a plan view for explaining a structure of a conventional pad, and FIGS. 2A to 2D are sectional views showing the manufacturing process of the pad shown in FIG. 1. FIGS. 1 to 2D show a gate pad structure which is extended from a gate line of an LCD. TCP is used as a medium. Referring to FIGS. 1 and 2A, a metal such as aluminum (Al) or chrome (Cr) is deposited on a substrate 60 generally formed of an insulating material, and is patterned to form a gate pad 10. Then, as shown in FIG. 2B, a silicon nitride layer is deposited on the entire surface of the substrate 60 formed with the gate pad 10 thereon via a plasma chemical vapor deposition (LPCVD) method, thereby forming a gate insulating layer 20.

As shown in FIG. 2C, an organic resist layer is coated on the entire surface of the gate pad 10 and a peripheral region thereof to form an organic insulating layer 30. In order to form an opening 11 in the gate insulating layer 20 to expose a portion of the gate pad 10, a mask 31 is placed over the organic insulating layer 30. Thereafter, the opening 11 for exposing the gate pad 10 is formed in the organic insulating layer 30 by an exposure and development process. The gate insulating layer 20 underlying the organic insulating layer 30 is also removed together to form the opening 11 that partially exposes the gate pad 10.

Then, as shown in FIG. 2D, a conductive layer 40 is formed along an inner surface of the opening 11 and organic insulating layer 30 at the periphery of the opening 11. The conductive layer 40 includes a metallic material such as aluminum or a transparent conductive material such as Indium Tin Oxide (ITO) or Indium Zinc Oxide (IZO).

Referring to FIG. 3, an anisotropic conductive film 70 includes conductive particles 71 and an adhesive material 72 is placed over the conductive layer 40 formed on the gate pad 10, and aligned with an output port 81 of a gate-side TCP 80. Then, a compressing operation is performed, to make an electrical connection between the conductive layer 40 and the output port 81 of the gate-side TCP 80 by means of the conductive particles 71.

The conductive particle 71 include a first conductive particle 71a, a seconds conductive particle 71b. The first conductive particle 71a is placed in the opening 11 and the seconds conductive particle 71b is placed on the surrounding portions of the opening 11. At this time, the difference in thickness of the second conductive particle 71b and the organic insulating layer 30 is not large enough to transfer a sufficient compressing force upon the second conductive particle 71b when compressing the second conductive particle 71b onto the gate pad 10. Therefore, the height difference between the organic insulating layer 30 and the gate pad 10 induces a problem that the gate-side TCP 80 is poorly bonded to the gate pad 10 or detached therefrom even after being adhered thereto.

Furthermore, if the gate-side TCP 80 is mistakenly bonded onto the gate pad 10, the gate-side TCP 80 should be detached from the gate pad 10, and correctly bonded again thereto. For re-attachment, the substrate is wiped by means of a cotton swab and so on for eliminating foreign materials remaining on the gate pad 10. The organic insulating layer 30 is, liable to be detached from the gate insulating layer 20 because of weak adhesive strength between them and the step between the organic insulating layer 30 and the gate pad 10. As a result, the conductive layer 40 formed on the organic insulating layer 30 is detached together with the organic insulating layer 30 and placed between adjacent pads, thereby causing a short between the pads.

However, the organic insulating layer 30 functions to prevent an electrical short between adjacent gate pads. For this reason, if the organic insulating layer 30 is removed at and around the gate pad 10, an electrical short may occur between adjacent gate pads, which lowers reliability of the resultant product. Therefore, the organic insulating layer 30 should not be thoroughly removed from the portion where the gate pad 10 is formed.

SUMMARY OF THE INVENTION

The present invention provides a displaying substrate capable of enhancing connection characteristics between a pad portion and a circuit substrate, and reducing a driving failure.

Also, the present invention provides a liquid crystal display device having a displaying substrate capable of enhancing connection characteristics between a pad portion and a circuit substrate, and reducing a driving failure.

In one aspect, the displaying substrate according to the present invention includes at least one pad portion for receiving an electrical signal from a circuit substrate. The pad portion has a pad metal layer which is formed on the displaying substrate and has a pad area. A passivation layer covers the pad metal layer and has a plurality of via holes to partially expose the pad area. Also, a conductive layer is formed over the passivation layer corresponding to the pad area and is electrically connected to the pad metal layer through the via holes.

Each of output ports of the circuit substrate is electrically connected to the conductive layer of the corresponding pad portion by an anisotropic conductive film interposed therebetween.

A width of the via hole is smaller than a diameter of a conductive particle of the anisotropic conductive film.

A deformation ratio of the conductive particle is about 20~60%. The width of the via hole is smaller than 0.8 times of the diameter of the conductive particle.

A depth of the via hole is smaller than a diameter of the conductive particle. The depth of the via hole can be 0.8 to 0.4 times of the diameter of the conductive particle.

The via holes have various shapes such as rectangles, squares, circles or ellipses when viewed from an upper side of the displaying substrate.

The displaying substrate may be used for one of LCD, PDP, FED and EL.

In another aspect, a liquid crystal display device according to the present invention includes a liquid crystal display panel which has a pad portion and a plurality of pixel portions and a circuit substrate that has output ports electrically connected to the pad portion of the liquid crystal display panel for applying an electrical signal to the liquid crystal display panel.

The pad portion of the liquid crystal display panel has a pad metal layer that is extended from one end portion of a plurality of signal lines connected to the pixel portions and has a pad area. A passivation layer covers the pad metal layer and includes a plurality of via holes to partially expose the pad area, and a conductive layer is formed on the passivation layer corresponding to the pad area. The conductive layer is electrically connected to the pad metal layer via the via holes.

Each of the output ports of the circuit substrate is electrically connected to the corresponding conductive layer of the pad portion by interposing an anisotropic conductive film.

According to the displaying substrate and liquid crystal display device as described above, the pad portion has the via holes for exposing the pad metal layer. A width of the via hole is formed to be smaller than a diameter of the conductive particle of the anisotropic conductive film. Where the width of the via hole is larger than the diameter of the conductive particle, the depth of the via hole is formed to be smaller than the diameter of the conductive particle.

Consequently, the driving failure which may be generated from the pad portion can be prevented, and the deformation ratio of the conductive particles is about 20~60%. Thus, the connection force between the pad portion and circuit substrate can be enhanced.

BRIEF DESCRIPTION OF THE DRAWINGS

The above and other advantages of the present invention will become more apparent by describing in detail exemplary embodiments with reference to the attached drawings, in which:

FIGS. 8A to 8E are sectional views showing the manufacturing process of the thin film transistor substrate according to one embodiment of the present invention;

DETAILED DESCRIPTION OF THE INVENTION

Figure 1:
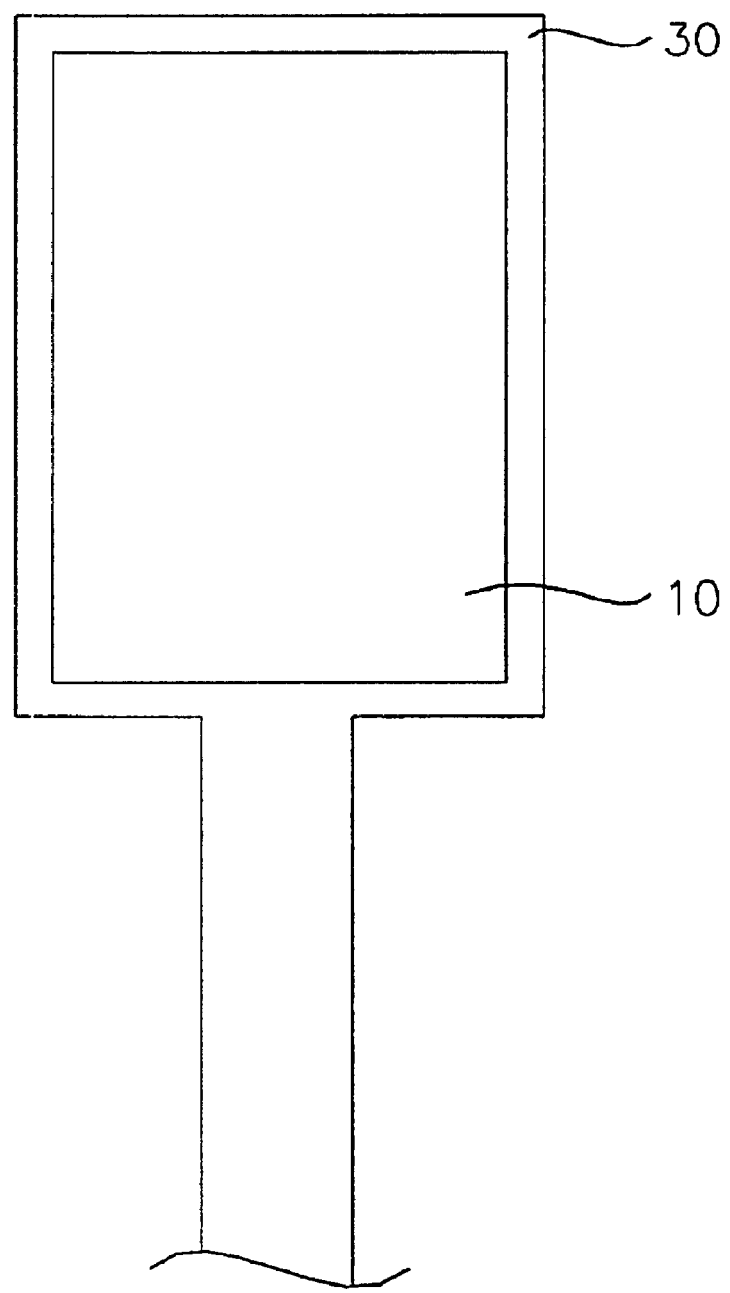
FIG. 1 is a plan view for explaining a structure of a conventional gate pad.
Figure 2A:
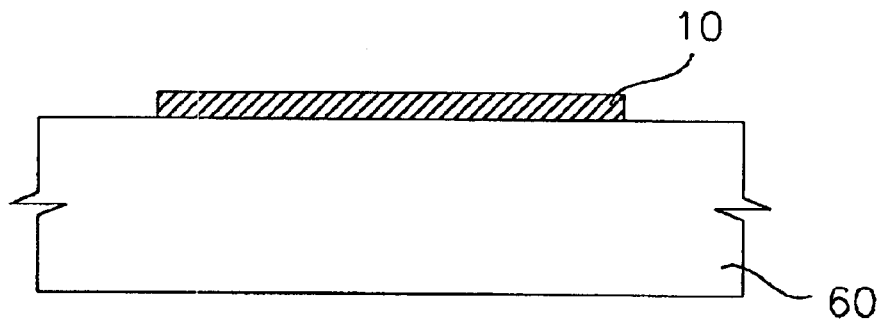
FIGS. 2A to 2D are sectional views for showing the process of manufacturing the gate pad shown in FIG. 1.
Figure 2B:
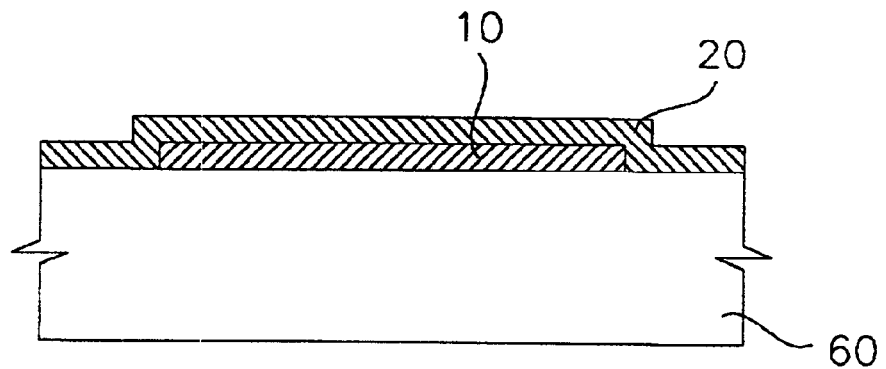
Figure 2C:
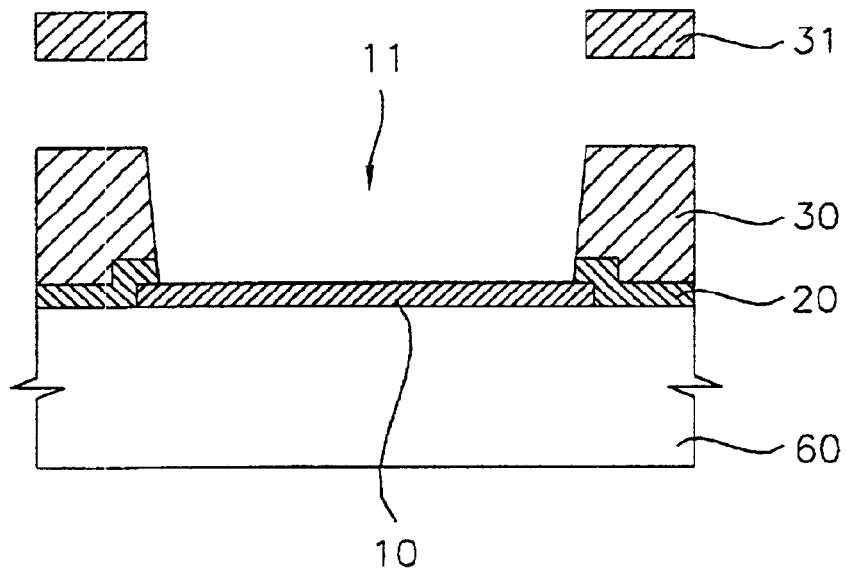
Figure 2D:
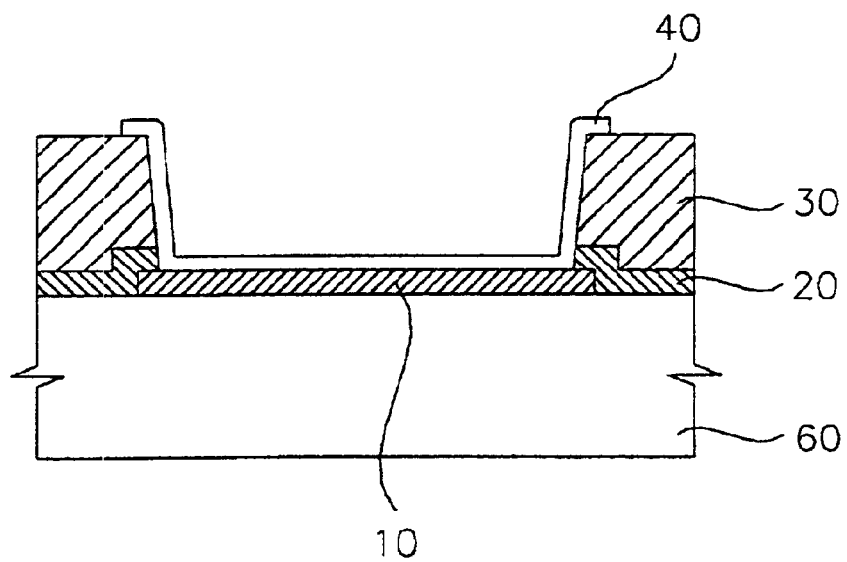
Figure 3:
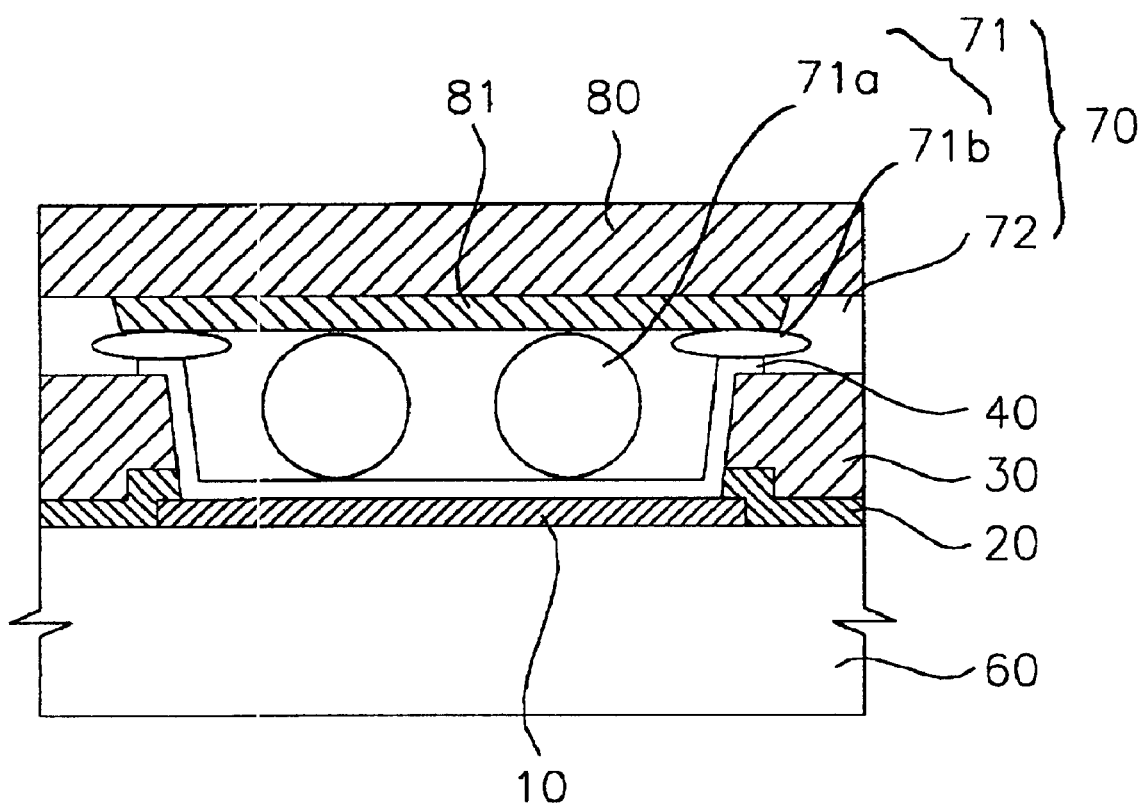
FIG. 3 is a sectional view showing that a gate-side TCP is connected to the gate pad.
Figure 4:
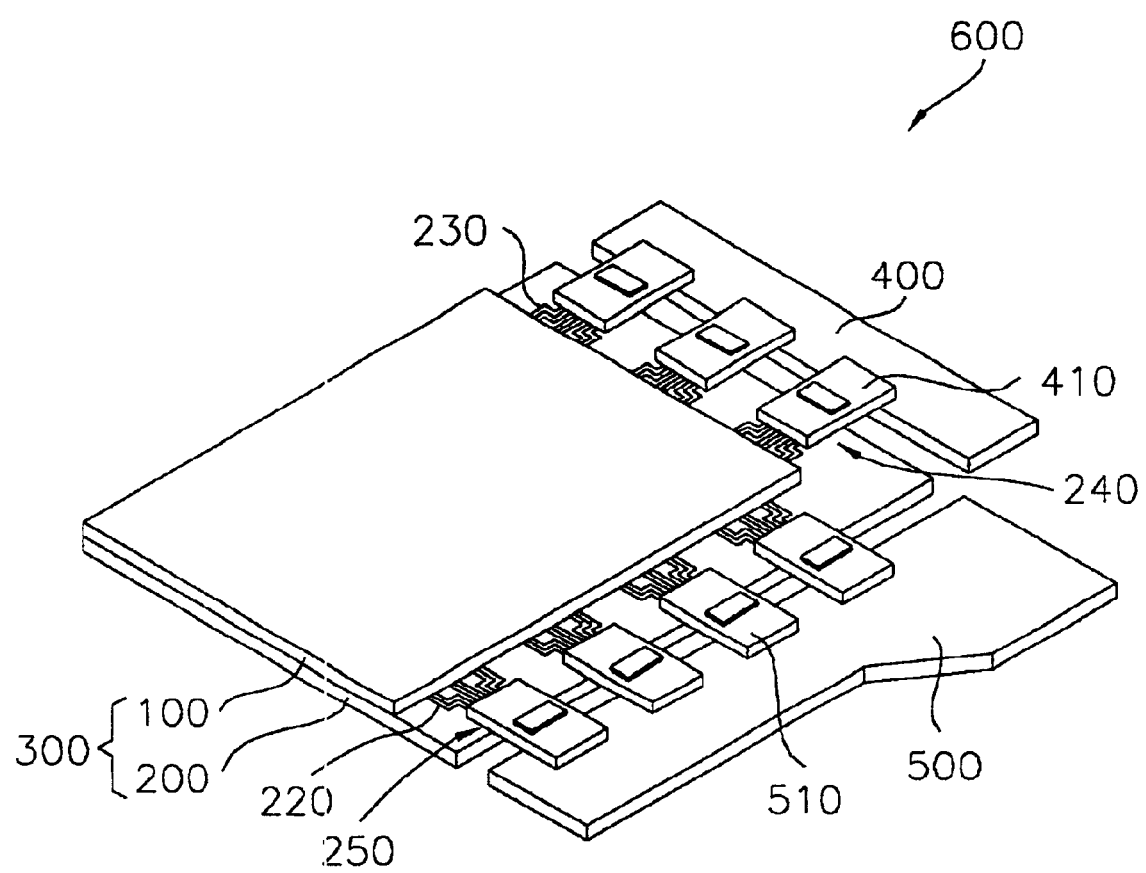
FIG. 4 is a perspective view showing an LCD according to one embodiment of the present invention.

The present invention will be described in detail with reference to accompanying drawings. FIG. 4 is a perspective view showing an LCD according to one exemplary embodiment of the present invention.

Referring to FIG. 4, an LCD 600 includes a liquid crystal display panel 300, and a gate PCB 400 and a data PCB 500 for applying a driving signal to the liquid crystal display panel 300.

The liquid crystal display panel 300 includes a TFT substrate 200, a color filter substrate 100 and a liquid crystal (not shown) injected between two substrates 200 and 100.

The TFT substrate 200 is a transparent glass plate formed with matrix-type TFTs (not shown). Source electrodes (214 in FIG. 8E) of the TFTs are connected with data lines 220, and gate electrodes (211 in FIG. 8E) are connected with gate lines 230. Additionally, a pixel electrode (not shown) which is formed of a transparent conductive substance such as ITO, is formed as drain electrodes.

The color filter substrate 100 is provided to face the TFT substrate 200. The color filter substrate 100 has RGB pixels which are formed, for example, via a thin film processing. The RGB pixels are color pixels for displaying predetermined colors when the light passes through them. The entire surface of the color filter substrate 100 is coated with a common electrode, for example, formed of ITO.

Figure 8E:
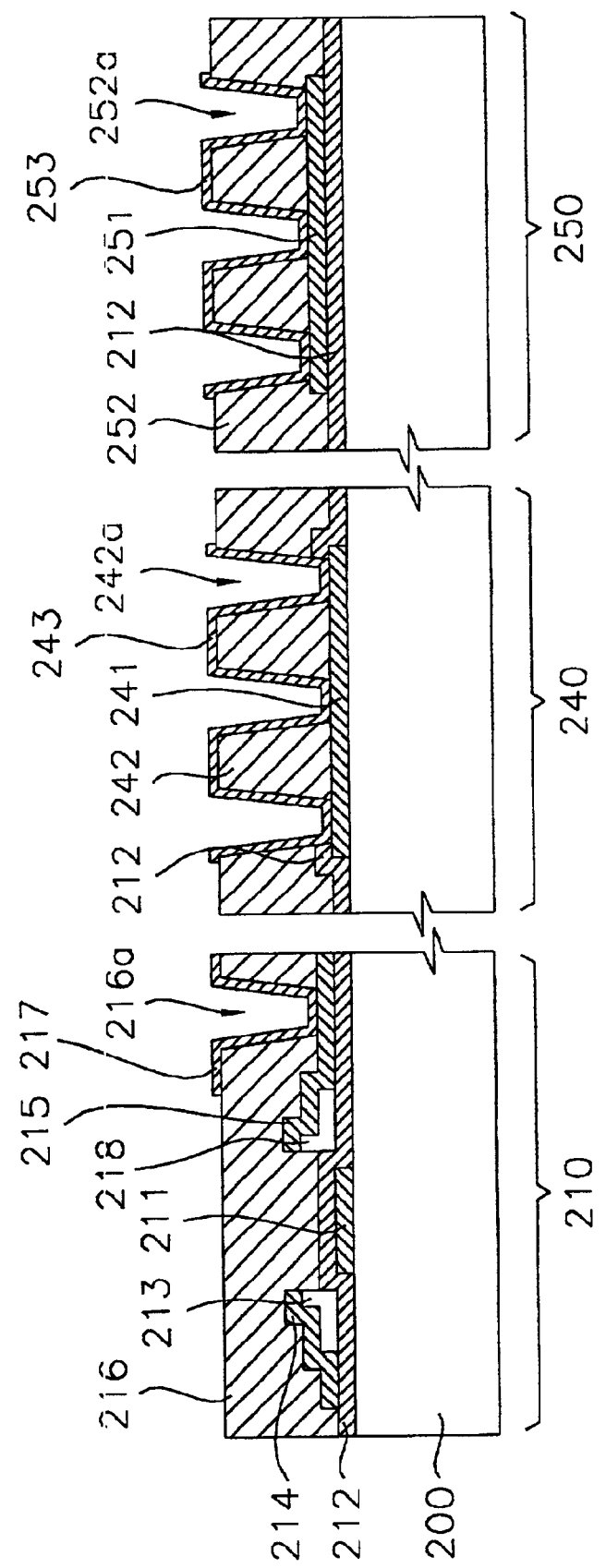

Referring to FIGS. 4 and 8E, once the TFT is turned-on by applying an electric power to the gate electrode 211 and the source electrode 214 of the transistor on the TFT substrate 200, an electric field is formed between the pixel electrode 217 and the common electrode of the color filter substrate 100. By this electric field, the alignment angle of the liquid crystal injected between the TFT substrate 200 and the color filter substrate 100 varies. In turn, the light transmissivity is changed in accordance with the varied alignment angle to provide a desired pixel.

In order to control the alignment angle of the liquid crystal and alignment timing of the liquid crystal in the liquid crystal display panel 300, the gate line 230 and the data line 220 of the TFT are supplied with a driving signal and a timing signal. As illustrated, the data pad portion 250 of the liquid crystal display panel 300 is attached with a data-side TCP 510 that determines the timing of applying the data driving signal, and the gate pad portion 240 thereof is attached with a gate-side TCP 410 that determines the timing of applying the gate driving signal.

The data PCB 500 and the gate PCB 400 receive an image signal from an outside of the liquid crystal display panel 300 to apply the driving signals to the gate line 230 and the data line 220, respectively. The data PCB 500 and the gate PCB 400 are respectively connected to the data-side TCP 510 and the gate-side TCP 410. The data PCB 500 has a source portion that receives the image signal generated from an external information processing apparatus (not shown) such as a computer to apply the data driving signal to the data line 220 of the liquid crystal display panel 300. Also, the gate PCB 400 has a gate portion for applying the gate driving signal to the gate line 230 of the liquid crystal display panel 300. In more detail, the data PCB 500 and the gate PCB 400 generate the gate driving signal, the data signal and a plurality of timing signals for driving these signals in a proper time. Then, the gate driving signal is applied to the gate line 230 via the gate-side TCP 410 and the data signal is applied to the data line 220 via the data-side TCP 510.

Figure 5:
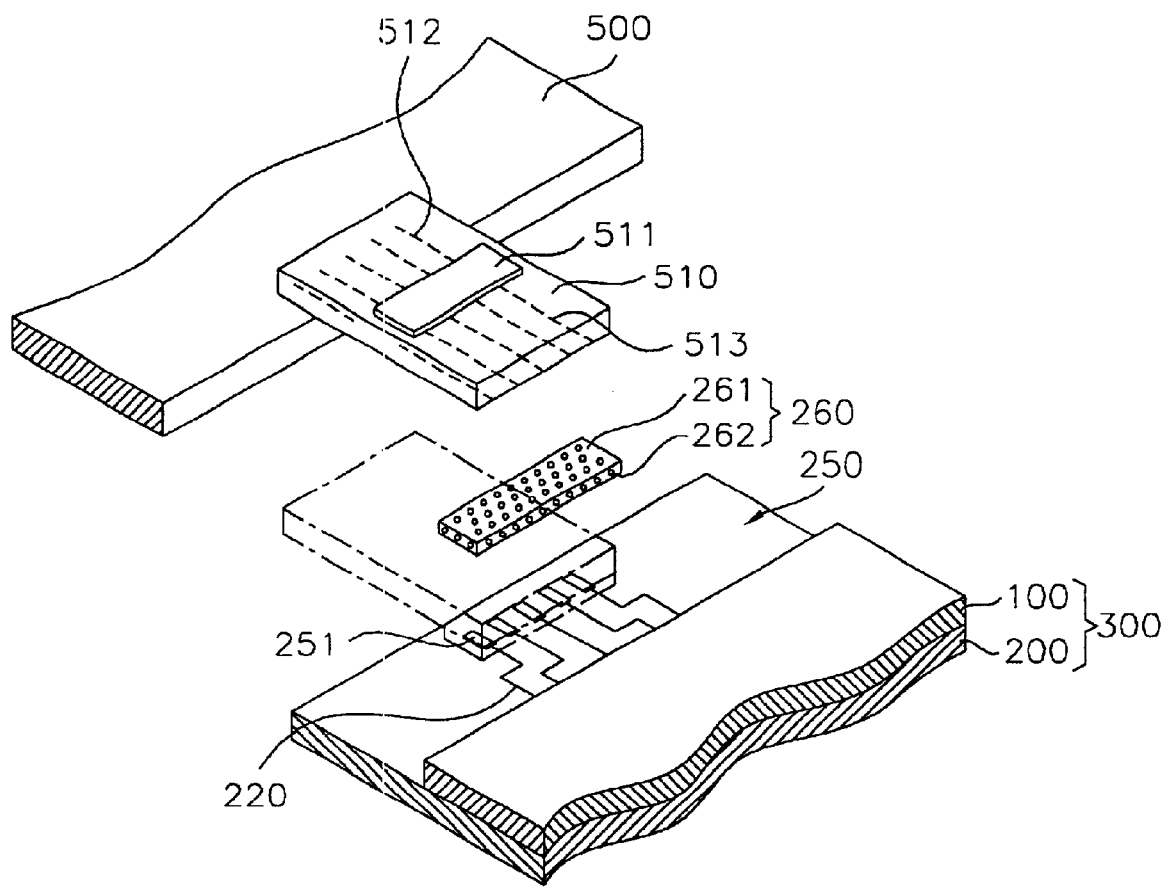
FIG. 5 is a cutaway perspective view of a specific mounting structure of the LCD shown in FIG. 4.

FIG. 5 is a cutaway perspective view of a specific mounting structure of the LCD shown in FIG. 4. The data pad portion 250 will be described and the description of the gate pad portion 240 is omitted because its structure is the same as that of the data pad portion 250.

Referring to FIG. 5, the data pad portion 250 of the TFT substrate 200 is formed with data pads 251 which extend from the data lines 220. The data-side TCP 510 has a driving IC chip 511 mounted thereon. The ports which are adjacent to the data PCB 500 from the driving IC chip 511 are input ports 512, and the ports adjacent to the liquid crystal display panel 300 from the driving IC chip 511 are output ports 513.

The data pads 251 are formed to respectively correspond to the output ports 513 of the data-side TCP 510. An anisotropic conductive film 260 is interposed between the data pads 251 and the output ports 513. The anisotropic conductive film 260 has an adhesive substance 261 for bonding the TFT substrate 200 with the data-side TCP 510 and conductive particles 262 for allowing the data pads 251 to make electrical contact with the output ports 513.

The TFT substrate 200 and the data-side TCP 510 are compressed to bond with each other under the state that anisotropic conductive film 260 is interposed between the data pads 251 and the output ports 513.

Figure 6:
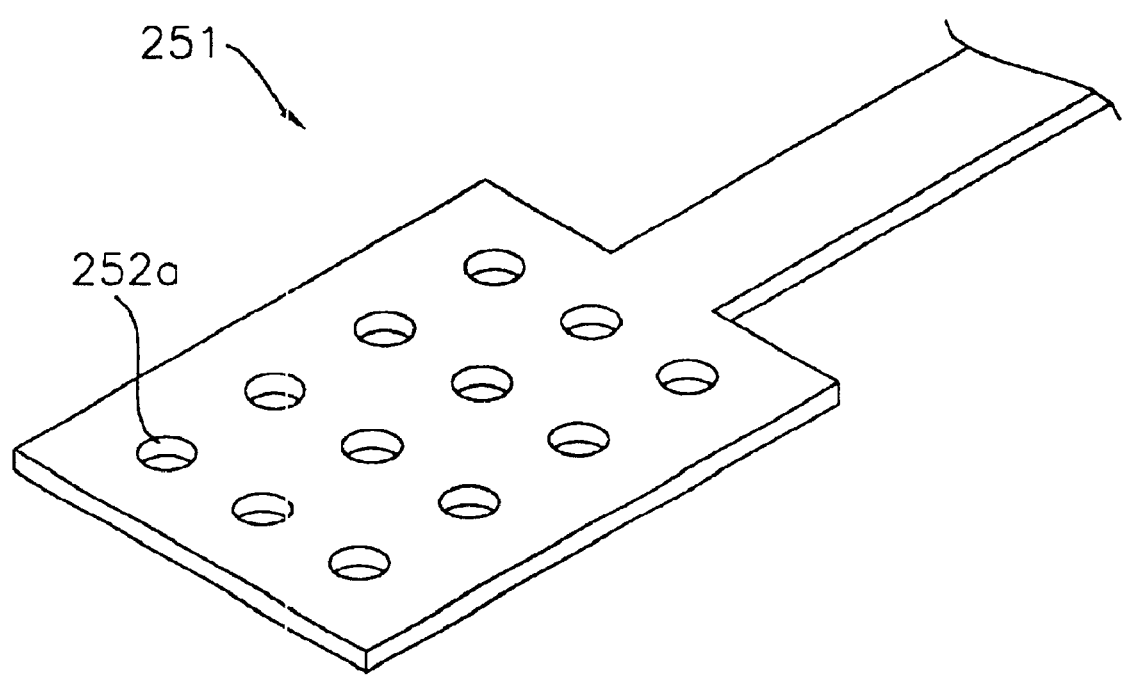
FIGS. 6 and 7 are enlarged views for specifically illustrating a data pad shown in FIG. 5.
Figure 7:
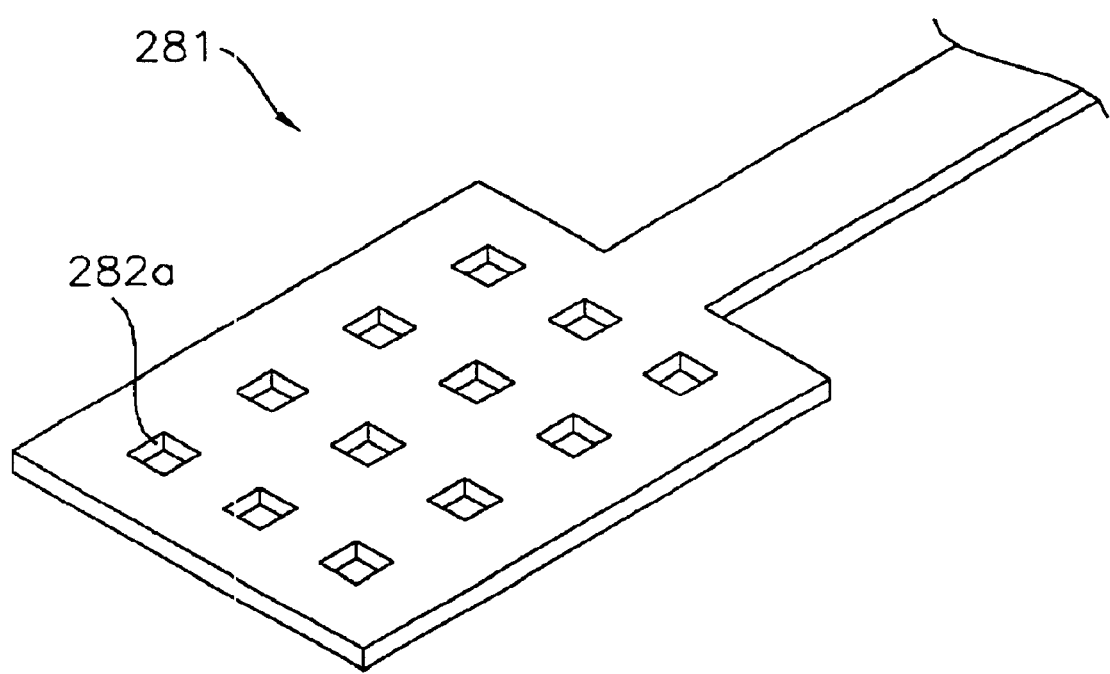

FIGS. 6 and 7 are enlarged views for specifically describing the data pad portion shown in FIG. 5. The gate pad portion 240 has the same structure as that of the data pad portion 250 and thus any further description upon gate pad portion 240 will be omitted.

Referring to FIGS. 6 and 7, a plurality of first and second via holes 252a and 282a are formed on the data pads 251 and 281 of data pad portions 250 and 280, respectively. The plurality of first and second via holes 252a and 282a are formed to have a predetermined width and depth, which will be described later. Also, the plurality of the first and second via holes 252a and 282a may have a shape such as a rectangular shape, a square shape (FIG. 6), a triangular shape, a circular shape (FIG. 7), or an ellipse shape when viewed from the upper plan of the substrate 200.

By partially exposing the data pad 251 via the plurality of first and second via holes 252a and 282a, the contact area between the data pad portions 250 and 280 and the conductive particles 262 can be increased.

Also, if the data-side TCP 510 needs to be detached from and bonded again to the data pad 251 due to an incorrect or undesirable attachment to the data pad 251, the data pad portions 250 and 280 are wiped out by means of a cotton swab, etc. so as to remove foreign materials remaining on the data pads 251. During this process, a force imposed upon the data pad portions 250 and 280 may be dispersed by means of the plurality of holes.

FIGS. 8A to 8E are sectional views showing a manufacturing process of the TFT substrate according to one embodiment of the present invention.

Referring to FIG. 8A, the TFT is formed as a switching element on the substrate 200 that includes a nonconductive material such as glass or ceramic. First, a metallic material such as aluminum (Al), molybdenum (Mo), chrome (Cr), tantalum (Ta), titanium (Ti), copper (Cu), tungsten (W) or an alloy including at least one of the foregoing is deposited on the substrate 200 to form metal layers. The substrate 200 has a pixel portion 210 formed with the TFT to display an image, and a gate pad portion 240 connected to a gate-side TCP 410 and a data pad portion 250 connected to a data-side TCP 510 as peripheral regions of the pixel portion 210.

The pixel portion 210 has a gate electrode 211 formed by patterning the metal layer via a photolithography process, and the gate electrode 211 is connected to the gate line 230 (shown in FIG. 4) Which is arranged in a width direction of the substrate 200 by a predetermined interval. For applying electrical signals to the pixel portion 210, a gate pad 241 is formed from the metal layer at the gate pad portion 240 of the peripheral regions of pixel portion 210. The gate pad 241 is extended from the gate line 230. The gate pad 241 is formed to have a width wider than that of the gate electrode 211 or the gate line 230.

The gate electrode 211, the gate pad 241 and the gate line 230 may be formed using an alloy of aluminum-copper (Al—Cu) or an alloy of aluminum-silicon-copper (Al—Si—Cu).

Referring to FIG. 8B, silicon nitride (SixNy) is deposited on the entire surface of the substrate 200 which has the gate electrode 211, the gate pad 241 and the gate line 230, for example, via a plasma chemical vapor deposition, thereby forming a gate insulating layer 212.

Thereafter, referring to FIG. 8C, an amorphous silicon layer and an n+ amorphous silicon layer doped with impurities by an in-situ method are sequentially stacked on the gate insulating layer 212, for example, via a plasma chemical vapor deposition method. Then, the stacked amorphous silicon layer and n+ amorphous silicon layer are patterned to thereby form a semiconductor layer 213 and an ohmic contact layer 218 on the gate insulating layer 212.

A laser having a predetermined intensity may be irradiated upon the amorphous silicon layer to convert the semiconductor layer 213 into a polysilicon layer.

A metal layer including a metal such as aluminum, molybdenum, tantalum, titanium, chrome, tungsten, copper or an alloy including at least one of the foregoing is stacked on the substrate 200, and the metal layer is patterned to form a data line 220 which is perpendicular to the gate line 230, and a source electrode 214 and a drain electrode 215 connected to the data line 220. A data pad 251 is formed on the date pad portion 250 to be connected to one end of the data line 220. As a result, at the pixel portion 210 of the substrate 200, the TFT including the gate electrode 211, the semiconductor layer 213, the ohmic contact layer 218, the source electrode 214 and the drain electrode 215 is formed. The gate pad portion 240 and the data pad portion 250 are formed with the gate pad 241 and the data pad 251, respectively. The gate insulating layer 212 is interposed between the data line 220 and the gate line 230 to prevent an electrical short between the data line 220 and the gate line 230.

Referring to FIG. 8D, a photosensitive organic resist is coated on the entire surface of the pixel portion 210, the gate pad portion 240 and the data pad portion 250 of the substrate 200, for example, via a spin coating method, thereby forming first, second and third passivation layers 216, 242 and 252.

Then, a mask 270 for forming a contact hole 216a and for exposing the gate pad 241 and the data pad 251 is placed over the first, second and third passivation layers 216, 242 and 252. Then, a full exposing process of a predetermined quantity of exposure (an exposing process with a sufficient light exposure amount for forming the contact hole) is carried out, and then a development process is performed so that the contact hole 216a for exposing the drain electrode 215 of the TFT is formed in the first passivation layer 216.

The second passivation layer 242 formed on the gate pad 241 of the gate pad portion 240 is partially removed via the full exposing and development processes. First via holes 242a for partially exposing the gate pad 241 are formed in the second passivation layer 242. The third passivation layer 252 formed on the data pad 251 of the data pad portion 250 is partially removed, to form second via holes 252a for partially exposing the data pad 251.

The first, second and third passivation layers 216, 242 and 252 include an organic insulating material such as bisbenzocyclobutene (BCB), perfluorocyclobutene (PFCB), etc. Also, the first, second and third passivation layers 216, 242 and 252 may be formed of an inorganic insulating material such as a silicon dioxide ($SiO_2$), silicon nitride (SiNx), etc.

Referring to FIG. 8E, a pixel electrode 217 that receives the image signals from the TFTs to generate an electric field together with the electrode of the upper plate is formed on the first passivation layer 210. The pixel electrode 217 is formed of a metal such as aluminum or a transparent conductive material such as ITO and IZO, which is connected to the drain electrode 215 via the contact holes 216a to receive the image signals.

A first conductive layer 243 is formed on the second passivation layer 242 corresponding to the gate pad 241 and on the gate pad 241 exposed by the first via holes 242a. Also, a second conductive layer 253 is formed on the third passivation layer 252 corresponding to the data pad 251 and on the data pad 251 exposed by the second via holes 252a. The first and second conductive layers 243 and 253 are formed of a metal such as aluminum or a transparent conductive material such as ITO and IZO. The first and second conductive layers 243 and 253 are uniformly coated on the second and third passivation layers 242 and 252 and on the gate and data pads 241 and 251 exposed by the first and second via holes 242a and 252a.

Figure 9:
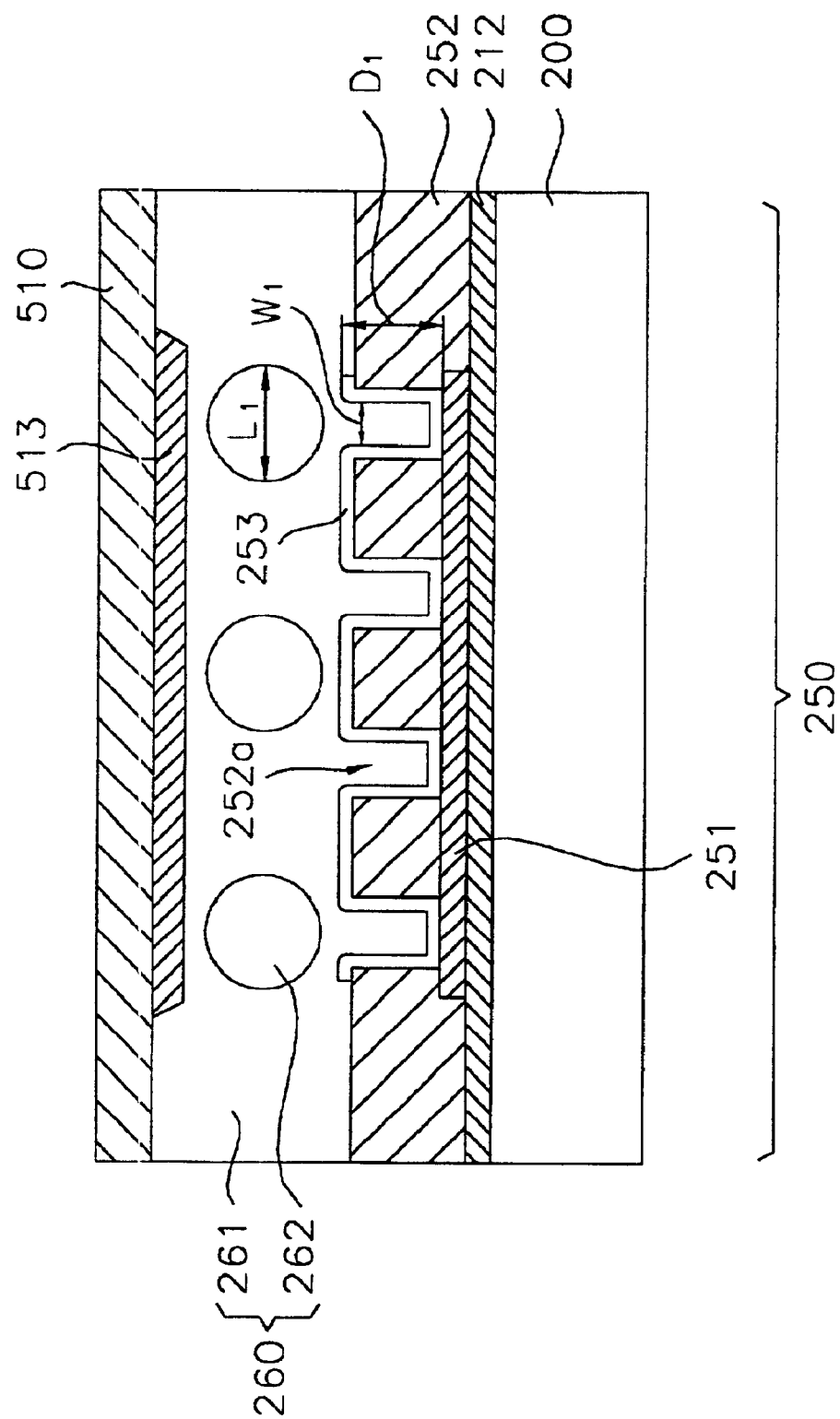
FIGS. 9 and 10 are sectional views showing the connecting procedure of the data pad and data-side TCP.
Figure 10:
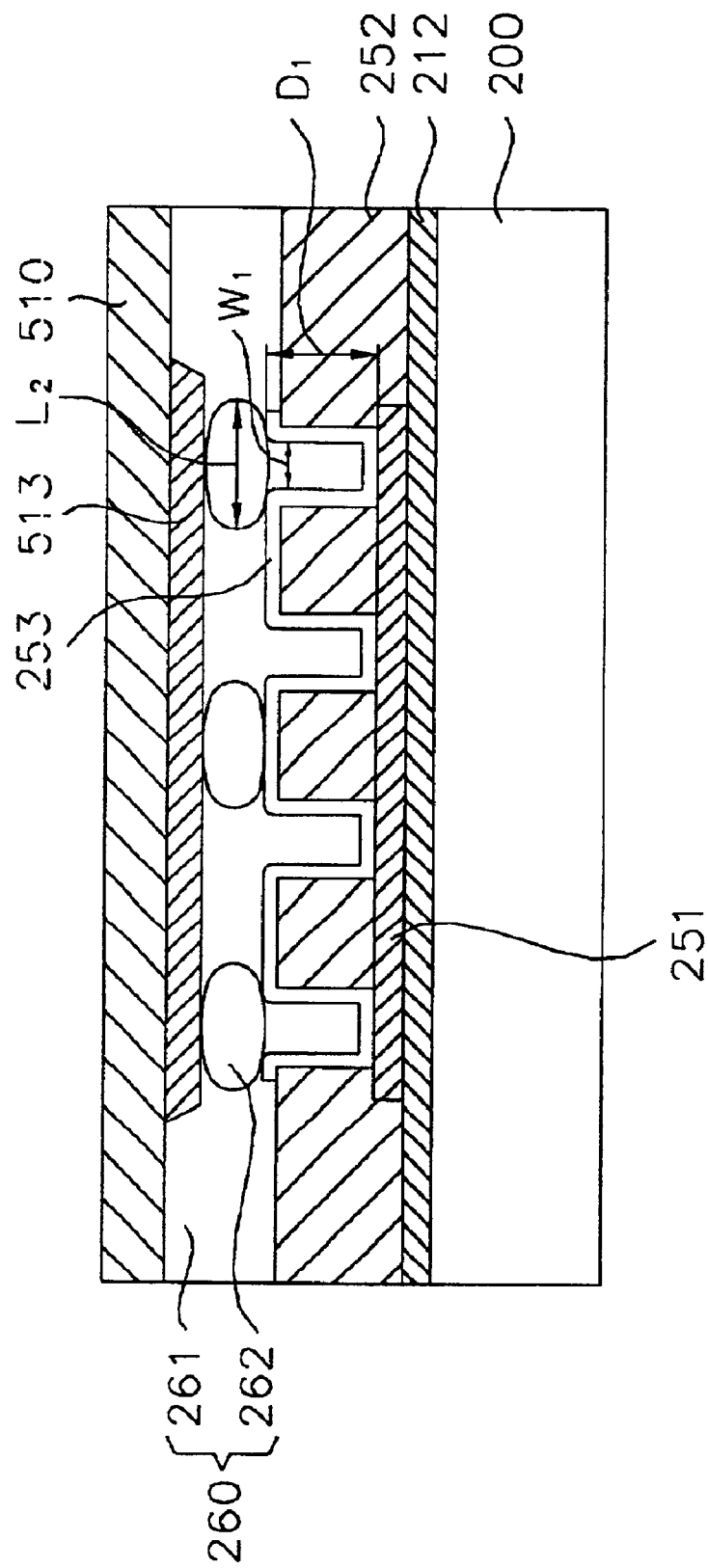

FIGS. 9 and 10 are sectional views showing a process of connecting the data pad and data-side TCP. The structure of the data pad with reference to FIGS. 9 and 10 is the same as that of the gate pad. Thus, detailed explanation concerning the gate pad and the gate-side TCP will be omitted.

Referring to FIG. 9, an anisotropic conductive film 260 including conductive particles 262 is placed over the data pad 251 formed on the data pad portion 250 of the substrate 200.

The data pad 251 has a plurality of second via holes 252a. A width W1 of the second via holes 252a is smaller than a depth D1 thereof. The width W1 of the second via holes 252a is smaller than a first diameter L1 of the conductive particle 262. The first diameter L1 of the conductive particles 262 is from about 3~10 μm. In this embodiment, the first diameter L1 of the conductive particle 262 is about 5 μm, and the width W1 of the second via holes 252a is smaller than 5 μm.

Output ports 513 which are adjacent to the data-side TCP 510 is arranged to face the data pad 251. Thereafter, the data-side TCP 510 and the data pad 251 are thermally compressed.

As shown in FIG. 10, once the data-side TCP 510 and the data pad 251 are compressed with each other, the conductive particles 262 make contact with the data-side TCP 510 and the second conductive layer 253 of the data pad 251 to electrically connect the data-side TCP 510 with the data pad 251.

As described above, once the conductive particles 262 make contact with the data-side TCP 510 and the second conductive layer 253 by the compression, the shape of the conductive particles 262 are changed. That is, the first diameter L1 of the conductive particles 262 is transformed into a second diameter L2 in a width direction after being subjected to the compression. The second diameter L2 is larger than the first diameter L1 (when viewed from a plan view).

A deformation ratio R of the conductive particles 262 before and after the compression is defined by the following Equation 1:

$$R=(L2-L1)/L1 \times 100$$

In view of the above Equation 1, the deformation ratio of the conductive particles 262 is preferably 20~60%. Where the first diameter L1 of the conductive particles 262 is about 5 μm (in average), the second diameter L2 of the conductive particle 262 is about 6~8 μm (in average).

In order to prevent the conductive particles 262 from being inserted into the second via holes 252a, the width W1 of the second via holes 252a is formed to be less than about 4 μm that is 0.8 times of the first diameter L1 of conductive particle 262. In other words, if the width W1 of the second via holes 252a is the same as the first diameter L1 of the conductive particles 262, the conductive particles 262 are not deformed so that the conductive particles 262 are inserted into the second via holes 252a.

The second via holes 252a have a sectional shape such as a rectangle as shown in this embodiment. Also, the second via holes 252a may have a trapezoidal shape as shown in FIG. 8E.

Figure 11:
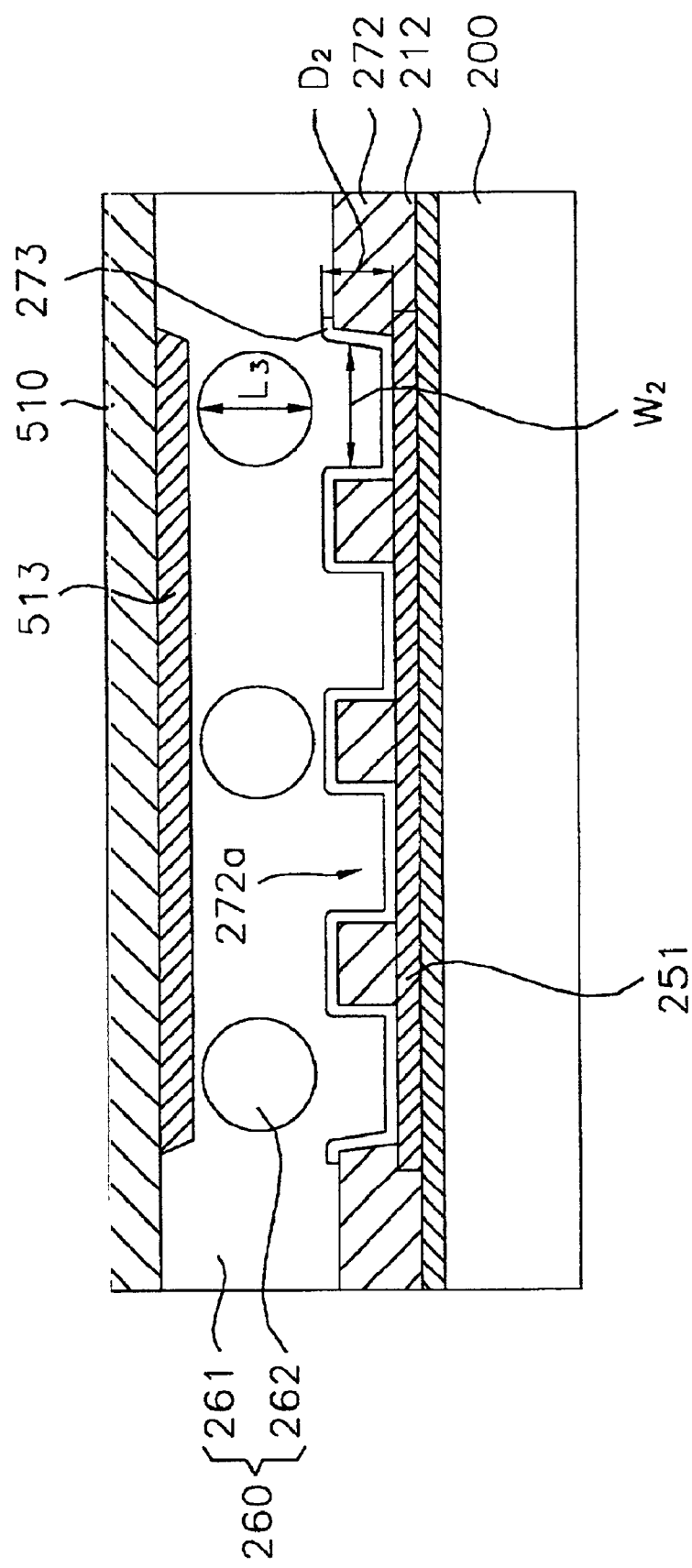
FIGS. 11 and 12 are sectional views showing the connecting procedure of the data pad and data-side TCP according to another embodiment of the present invention.
Figure 12:
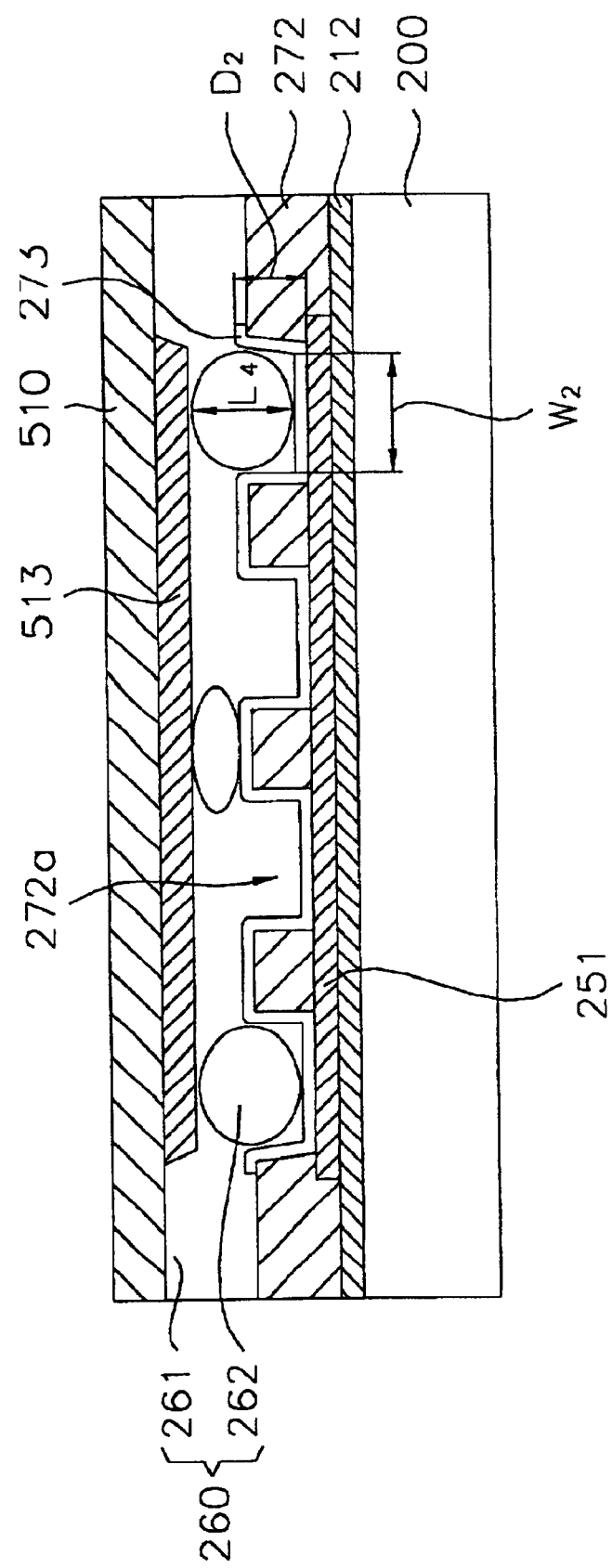

FIGS. 11 and 12 are sectional views showing a connecting process of the data pad and data-side TCP according to another embodiment of the present invention.

Referring to FIG. 11, an anisotropic conductive film 260 including conductive particles 262 is placed over the data pad 251 formed at the data pad portion 250 of the substrate 200.

A plurality of third via holes 272a is formed in a fourth passivation layer 272 to expose a portion of the data pad 251. A third conductive layer 273 is formed on the fourth passivation layer 272 corresponding to the data pad 251. The third conductive layer 272 is formed of a metal such as aluminum or a transparent conductive material such as ITO and IZO. A depth D2 of the third via holes 272a is larger than a width W2 of the third via holes 272a. The width W2 of the third via holes 272a is smaller than a third diameter L3 of the conductive particles 262. More specifically, where the third diameter L3 of the conductive particle 262 is 5 μm, the depth D2 of the third via holes 272a is smaller than 5 μm.

Output ports 513 formed at the data-side TCP 510 are arranged to face the data pad 251. Thereafter, the data-side TCP 510 and the data pad 251 are thermally compressed.

As shown in FIG. 12, once the data-side TCP 510 and the data pad 251 are compressed, the conductive particles 262 make contact with the data-side TCP 510 and the third conductive layer 273 of the data pad 251 to electrically connect the data-side TCP 510 with the data pad 251.

As described above, once the conductive particles 262 make contact with the data-side TCP 510 and the third conductive layer 273 by the compression, the shape of conductive particles 262 are changed. That is, the third diameter L3 of the conductive particle 262 is transformed into a fourth diameter L4 in a length direction after being subjected to the compression. The fourth diameter L4 of the conductive particles 262 is smaller than the third diameter L3.

A deformation ratio R of the conductive particles 262 before and after the compression is defined by the following Equation 2:

$$R=(L3-L4)/L3\times 100$$

In view of the above Equation 2, the deformation ratio of the conductive particles 262 is about 20~60%. In more detail, where the third diameter L3 of conductive particles 262 is about 5 μm (in average), the fourth diameter L4 of the conductive particles 262 is about 2~4 μm.

The depth D2 of the third via holes 272a is equal to or less than the fourth diameter L4 of conductive particle 262. That is, the depth D2 of third via holes 272a is about 2~4 μm that is about 0.4 to 0.8 times of the third diameter L3 of the conductive particles 262.

According to the above-described displaying substrate and LCD having the same, the pad portion has the plurality of via holes that expose the pad metal layer. The width of the via hole is formed to be smaller than the diameter of the conductive particles. Where the width of the via hole is larger than the diameter of the conductive particle, the depth of the via hole is formed to be smaller than the diameter of the conductive particles.

Therefore, by forming a plurality of via holes at the pad portion, an external force imposed upon the pad portion is dispersed through the plurality of via holes to be capable of preventing a driving failure.

Also, because the size of the via hole is formed considering the diameter of the conductive particles, the deformation ratio of the conductive particles can be maintained from about 20% to about 60%, which reinforces the connection between the pad portion and circuit substrate.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A displaying substrate comprising at least one pad portion for receiving an electrical signal from a circuit substrate, said pad portion comprising:
   a pad metal layer formed on said displaying substrate and having a pad area;
   a passivation layer for covering said pad metal layer, said passivation layer having a plurality of via holes to partially expose said pad area; and
   a conductive layer, formed over said passivation layer corresponding to said pad area, said conductive layer being electrically connected to said pad metal layer through said via holes
   wherein said via holes each have a width smaller than a diameter of a conductive particle of a conductive film of said circuit substrate, so that said conductive particle is in contact with an upper portion of said via hole and no contact exists between said conductive particle and a bottom of said via hole.

2. The displaying substrate as claimed in claim 1, wherein said circuit substrate includes an output port, said output port being electrically connected to said conductive layer by an anisotropic conductive film interposed therebetween.

3. The displaying substrate as claimed in claim 2, wherein a depth of each of said via holes is smaller than a diameter of a conductive particle of said anisotropic conductive film.

4. The displaying substrate as claimed in claim 3, wherein the depth of said via hole is 0.8 to 0.4 times of the diameter of said conductive particle.

5. The displaying substrate as claimed in claim 1, wherein a deformation ratio of said conductive particle is about 20~60%.

6. The displaying substrate as claimed in claim 1, wherein the width of said via hole is smaller than 0.8 times of the diameter of said conductive particle.

7. The displaying substrate as claimed in claim 1, wherein said via holes has a shape of rectangles, squares, circles or ellipses when viewed front an upper side of said displaying substrate.

8. The displaying substrate as claimed in claim 1, wherein said displaying substrate is used for one of LCD, PDP, FED and EL.

9. The displaying substrate as claimed in claim 1, wherein each or said via holes has said width and a depth, said width being smaller than said depth.

10. The displaying substrate as claimed in claim 9, wherein said pad metal layer and said conductive layer are in contact with each other only through said bottom of said via hole.

11. A liquid crystal display device comprising:
- a liquid crystal display panel including a) a plurality of pixel portions formed on a substrate, b) a pad portion which has a pad metal layer extended from one end portion of a plurality of signal lines connected to said pixel portions and having a pad area, a passivation layer for covering said pad metal layer and having a plurality of via holes to partially expose said pad area, and a conductive layer formed on said passivation layer corresponding to said pad area and electrically connected to said pad metal layer through said via holes; and
- a circuit substrate having an output port electrically connected to said pad portion or said liquid crystal display panel for applying an electrical signal to said liquid crystal display panel
wherein said via holes each have a width smaller than a diameter of a conductive particle of a conductive film of said circuit substrate, so that said conductive contact with an upper portion of said via hole and no contact exists between said conductive particle and a bottom of said via hole.

12. The liquid crystal display device as claimed in claim 11, wherein said output port of said circuit substrate is electrically connected to said conductive layer by an anisotropic conductive film interposed therebetween.

13. The liquid crystal display device as claimed in claim 12, wherein a depth of each of said via holes is smaller than a diameter of a conductive particle of said anisotropic conductive film.

14. The displaying substrate as claimed in claim 13, wherein the depth of said via hole is 0.8 to 0.4 times of the diameter of said conductive particle.

15. The displaying substrata as claimed in claim 11, wherein the width of said via hole is smaller than 0.8 times of the diameter of said conductive particle.

16. The liquid crystal display device as claimed in claim 11, wherein each of said via holes has said width and a depth, said width being smaller than said depth.

17. The liquid crystal display device as claimed in claim 16, wherein said pad metal layer and said conductive layer are in contact with each other only through said bottom of said via hole.

* * * * *

UNITED STATES PATENT AND TRADEMARK OFFICE
CERTIFICATE OF CORRECTION

PATENT NO. : 6,771,348 B2
APPLICATION NO. : 10/159149
DATED : August 3, 2004
INVENTOR(S) : Weon-Sik Oh et al.

It is certified that error appears in the above-identified patent and that said Letters Patent is hereby corrected as shown below:

Title Page:
Item (73), Assignee, after "Samsung Electronics Co., Ltd.", delete "(JP)" and insert therefor --(KR)--;

Column 2:
Line 58, after "71", delete "include" and insert therefor --includes--;
Line 59, after "71a", delete ",a seconds" and insert therefor --and a second--;
Line 61, before "conductive", delete "seconds" and insert therefor --second--;

Column 3:
Line 12, after "is", delete ",";

Column 6:
Line 62, before "is", delete "Which" and insert therefor --which--;

Column 8:
Line 45, after "510", delete "is" and insert therefor --are--;

Column 9:
Line 30, after "layer", delete "272" and insert therefor --273--;

Column 10:
Line 62, after "holes", delete "has" and insert therefor --have--;
Line 63, after "viewed", delete "front" and insert therefor --from--;

UNITED STATES PATENT AND TRADEMARK OFFICE
CERTIFICATE OF CORRECTION

PATENT NO. : 6,771,348 B2
APPLICATION NO. : 10/159149
DATED : August 3, 2004
INVENTOR(S) : Weon-Sik Oh et al.

It is certified that error appears in the above-identified patent and that said Letters Patent is hereby corrected as shown below:

<u>Column 11:</u>
Line 20, after "portion", delete "or" and insert therefor --of--;
Line 25, after "conductive", insert --particle is in--.

Signed and Sealed this

Eighth Day of May, 2007

JON W. DUDAS
*Director of the United States Patent and Trademark Office*